US012382771B2

(12) United States Patent
Liu et al.

(10) Patent No.: US 12,382,771 B2
(45) Date of Patent: Aug. 5, 2025

(54) SPLICING DISPLAY DEVICE (71) Applicant: TCL China Star Optoelectronics Technology Co., Ltd., Guangdong (CN)

(72) Inventors: Xin Liu, Guangdong (CN); Hongyuan Xu, Guangdong (CN); Juncheng Xiao, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/772,590

(22) PCT Filed: Apr. 19, 2022

(86) PCT No.: PCT/CN2022/087559
§ 371 (c)(1),
(2) Date: Apr. 28, 2022

(87) PCT Pub. No.: WO2023/193292
PCT Pub. Date: Oct. 12, 2023

(65) Prior Publication Data
US 2024/0204036 A1    Jun. 20, 2024

(30) Foreign Application Priority Data
Apr. 8, 2022    (CN) .......................... 202210368609.9

(51) Int. Cl.
*G09G 5/00*     (2006.01)
*G06F 3/14*     (2006.01)
*H10H 29/14*    (2025.01)

(52) U.S. Cl.
CPC ................. *H10H 29/142* (2025.01)

(58) Field of Classification Search
CPC .......... G02F 1/13336; G02F 1/133603; G02F 1/133388; H01L 25/0753; H01L 27/156
See application file for complete search history.

(56) References Cited

U.S. PATENT DOCUMENTS 10,565,922 B2 *  2/2020  Huang ................. G09G 3/3648
12,132,030 B2   10/2024  Chen et al.
(Continued)

FOREIGN PATENT DOCUMENTS

CN     106537235      3/2017
CN     111816091      10/2020
(Continued)

OTHER PUBLICATIONS

International Search Report and the Written Opinion Dated Dec. 15, 2022 From the International Searching Authority Re. Application No. PCT/CN2022/087559 and Its Translation Into English. (22 Pages).

(Continued)

*Primary Examiner* — Kyoung Lee
*Assistant Examiner* — David J Goodwin (57) ABSTRACT

The present application discloses a splicing display device including a first light emission region disposed adjacent to a splicing gap. The first light emission region is located between a second light emission region and the splicing gap. Along a first direction, a first interval is defined between adjacent two of the light emission units disposed in first light emission region, and a second interval is defined between adjacent two of the light emission units disposed in the second light emission region. The first interval is greater than second interval.

4 Claims, 4 Drawing Sheets

(56) References Cited

U.S. PATENT DOCUMENTS

| | | | | |
|---|---|---|---|---|
| 2016/0093244 A1* | 3/2016 | Kazmierski | ........... | G06F 3/1446 345/1.3 |
| 2022/0052030 A1* | 2/2022 | Zhang | ................... | G06F 3/1446 |
| 2023/0015454 A1* | 1/2023 | Hirai | ........................ | G09G 5/36 |
| 2023/0140130 A1* | 5/2023 | Chen | ................... | H01L 25/0753 257/88 |

FOREIGN PATENT DOCUMENTS

| | | |
|---|---|---|
| CN | 114373778 | 4/2022 |
| JP | 2006-041283 | 2/2006 |
| JP | 2011-075825 | 1/2011 |
| TW | I756986 | 3/2022 |
| WO | WO 2022/007075 | 1/2022 |
| WO | WO 2022/041448 | 3/2022 |

OTHER PUBLICATIONS

Notification of Office Action and Search Report Dated Apr. 24, 2025 From The State Intellectual Property Office of the People's Republic of China Re. Application No. 202210368609.9 and Its Translation Into English. (16 Pages).

\* cited by examiner

100
SPLICING DISPLAY DEVICE

RELATED APPLICATIONS

This application is a National Phase of PCT Patent Application No. PCT/CN2022/087559 having International filing date of Apr. 19, 2022, which claims the benefit of priority of Chinese Patent Application No. 202210368609.9 filed on Apr. 8, 2022. The contents of the above applications are all incorporated by reference as if fully set forth herein in their entirety.

FIELD AND BACKGROUND OF THE INVENTION

The present application relates to a field of display technologies, especially to a splicing display device.

With gradual increase for applications of large size display devices, a splicing display device becomes one of current researching hotspots. However, a conventional splicing display device has a greater in a gap of a splicing slit, which results in a visually obvious splicing slit when the splicing display device displays.

Therefore, setting forth a technical solution to solve an issue of a splicing display device having a greater gap in a splicing slit to influence display is necessary.

SUMMARY OF THE INVENTION

Technical Issue

An objective the present application is to provide a splicing display device to solve the issue of a splicing display device having a greater gap in a splicing slit to influence display.

Technical Solution

A splicing display device comprises:
- at least two light emission substrates spliced together, wherein a splicing gap is formed between adjacent two of the light emission substrates spliced together along a first direction, the first direction intersects an extension direction of the splicing gap, the light emission substrates comprises a light emission region, the light emission region comprises a first light emission region and a second light emission region arranged abreast along the first direction, the first light emission region is disposed adjacent to the splicing gap, the first light emission region is located between the second light emission region and the splicing gap, and the light emission substrates comprises:
- a plurality of light emission units disposed in the light emission region;
- wherein along the first direction, a first interval is defined between adjacent two of the light emission units disposed in the first light emission region, a second interval is defined between adjacent two of the light emission units disposed in the second light emission region, the first interval is greater than the second interval.

Advantages

The present application provides a splicing display device, the splicing display device comprises at least two light emission substrates spliced together, wherein a splicing gap is formed between adjacent two of the light emission substrates spliced together along a first direction, the first direction intersects an extension direction of the splicing gap, the light emission substrates comprises a light emission region, the light emission region comprises a first light emission region and a second light emission region arranged abreast along the first direction, the first light emission region is disposed adjacent to the splicing gap, the first light emission region is located between the second light emission region and the splicing gap, and the light emission substrates comprises a plurality of light emission units disposed in the light emission region; wherein along the first direction, a first interval is defined between adjacent two of the light emission units disposed in the first light emission region, a second interval is defined between adjacent two of the light emission units disposed in the second light emission region, the first interval is greater than the second interval. It advantages the first interval between adjacent two of the light emission units in the first light emission region to be the same as or similar to an interval between adjacent two of the light emission units on two sides of a splicing gap between adjacent two of the light emission substrates. When the splicing display device displays, brightness of the splicing gap between adjacent two of the light emission substrates approximates to brightness of the first light emission region, which prevents the brightness of the splicing gap of the splicing display device from being apparently different from brightness of other region of the light emission substrate and facilitates the splicing gap not easily recognized by human's eyes.

DESCRIPTION OF SPECIFIC EMBODIMENTS OF THE INVENTION

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

Figure 1:
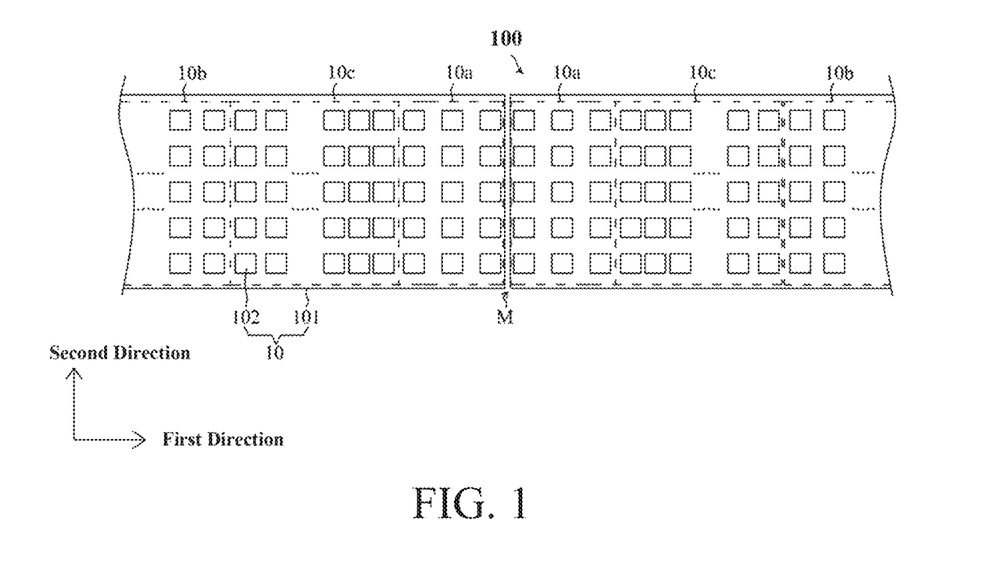
FIG. 1 is a schematic view of a splicing display device of the first embodiment of the present application.

With reference to FIG. 1, FIG. 1 is a schematic view of a splicing display device of the first embodiment of the present application. The splicing display device 100 comprises at least two light emission substrates 10 spliced together. Along a first direction, a splicing gap M is defined between adjacent two of the light emission substrates 10 spliced together. The splicing gap M extends along a second direction, and the first direction intersects the second direction. In particular, the first direction is perpendicular to the second direction.

The light emission substrates 10 comprises a light emission region, and the light emission region comprises a first light emission regions 10a, a second light emission region 10b, and a third light emission region 10c disposed and arranged abreast along the first direction. The first light emission regions 10a is disposed adjacent to the splicing gap M, the first light emission regions 10a is located between the third light emission region 10c and the splicing gap M, and the third light emission region 10c is located between the first light emission regions 10a and the second light emission region 10b.

For each of the light emission substrates 10, along the first direction, a size of the second light emission region 10b is greater than a size of the first light emission regions 10a and a size of the third light emission region 10c; along the second direction, the size of the second light emission region 10b, the size of the first light emission regions 10a is equal to the size of the third light emission region 10c.

For two of the light emission substrates 10 spliced with each other, along the first direction, two adjacent first light emission regions 10a are disposed symmetrically on two sides of the splicing gap M. One third light emission region 10c is disposed on a side of each of the first light emission regions 10a away from the splicing gap M. One second light emission region 10b is disposed on a side of each of the third light emission region 10c away from the splicing gap M.

The light emission substrates 10 comprises a substrate 101 and a plurality of light emission units 102 disposed on the substrate 101. The light emission units 102 are located in the light emission region, the light emission units 102 are arranged in an array on the substrate 101 along a row direction and a column direction. The row direction is parallel to the first direction, and the column direction is parallel to the second direction.

The substrate 101 is a thin film transistor array substrate, the thin film transistor array substrate comprises an underlay and a plurality of thin film transistors disposed on the underlay and arranged in an array. underlay can be a rigid underlay or a flexible underlay. The rigid underlay comprises a glass underlay, and the flexible underlay comprises a polymer underlay. It can be understood that the substrate 101 can also be a printed circuit board.

The light emission units 102 is a mini light emitting diode (Mini LED). It can be understood that the light emission units 102 can also be a micro light emitting diode (Micro LED) or an organic light emitting diode.

Figure 2:
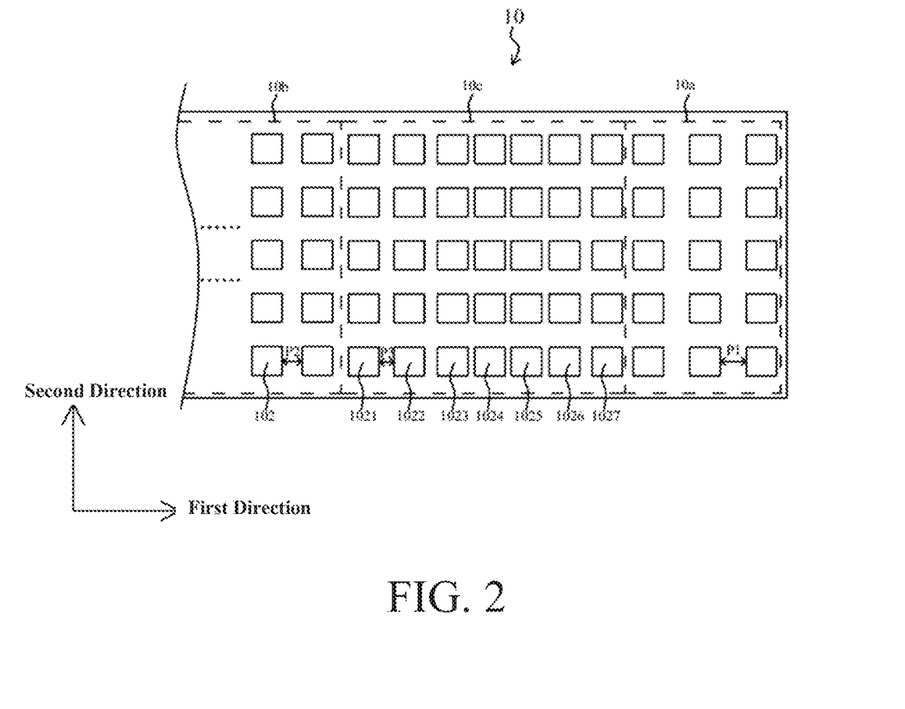
FIG. 2 is a first partially enlarged schematic view of light emission substrates of the splicing display device in FIG. 1.
Figure 3:
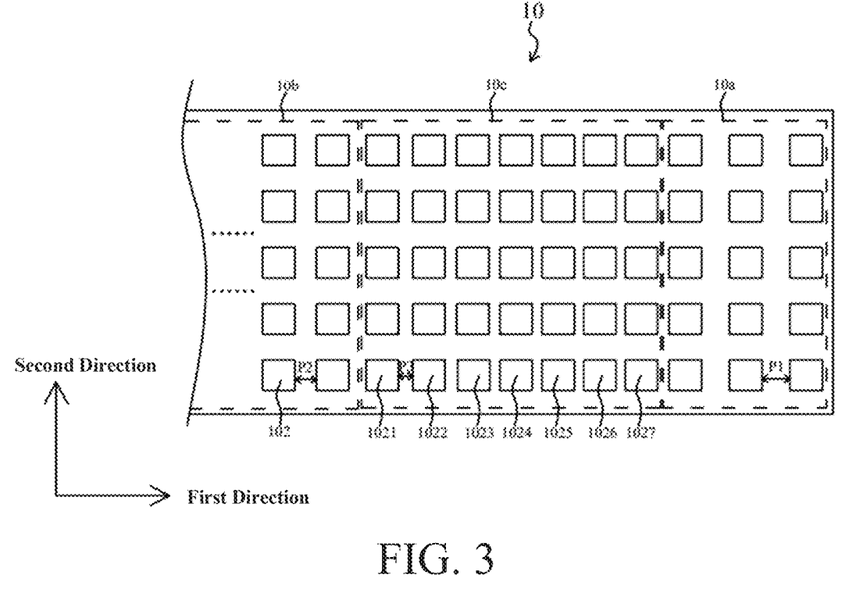
FIG. 3 is a second partially enlarged schematic view of the light emission substrates of the splicing display device in FIG. 1.
Figure 4:
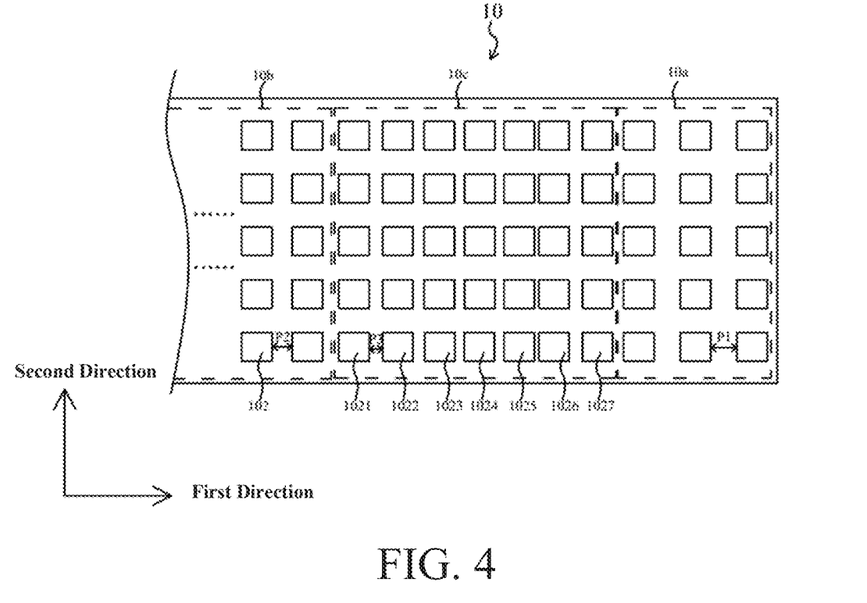
FIG. 4 is a third partially enlarged schematic view of the light emission substrates of the splicing display device in FIG. 1.

With reference to FIGS. 2 to 4, FIG. 2 is a first partially enlarged schematic view of light emission substrates of the splicing display device in FIG. 1, FIG. 3 is a second partially enlarged schematic view of the light emission substrates of the splicing display device in FIG. 1, FIG. 4 is a third partially enlarged schematic view of the light emission substrates of the splicing display device in FIG. 1. Along the first direction, a first interval P1 is defined between adjacent two of the light emission units 102 disposed in the first light emission regions 10a, and a second interval P2 is defined between adjacent two of the light emission units 102 disposed in the second light emission region 10b. The first interval P1 is greater than the second interval P2, which advantages the first interval P1 between adjacent two of the light emission units 102 in the first light emission regions 10a to be similar to or the same as an interval between adjacent two of the light emission units 102 on two sides of the splicing gap M between adjacent two of the light emission substrates 10. When the splicing display device 100 displays, brightness of the splicing gap M between adjacent two of the light emission substrates 10 is similar to or tends to be the same as brightness of the first light emission regions 10a, which prevents the brightness of the splicing display device 100 in the splicing gap M from being apparently different from brightness of other regions of the light emission substrates 10 to advantage the splicing gap M not easily recognized.

It should be explained that because an end of the light emission substrates 10 near the splicing gap M needs to be bonded to a flexible chip on film, it results in that the splicing gap M cannot be eliminated. Generally, a size of the splicing gap M is apparently greater than the second interval P2 between adjacent two of the light emission units 102 in the second light emission region 10b to cause the interval between adjacent two of the light emission units 102 of two sides of the splicing gap M to be apparently greater than the second interval P2, which results in that when the splicing display device 100 displays, the brightness of the splicing gap M is apparently less than brightness of the second light emission region 10b. The splicing display device 100 of the present embodiment sets a ratio percentage of brightness of the splicing gap M to brightness of the first light emission regions 10a disposed adjacent to the splicing gap M to be greater than or equal to 97% such that the brightness of the splicing gap M is similar to or tends to be the same as the brightness of the first light emission regions 10a disposed adjacent to the splicing gap M, which prevents the brightness of the splicing display device 100 from the splicing gap M from being apparently different from the brightness of other region of the light emission substrates to advantage the splicing gap not easily recognized by human's eyes.

When the splicing display device 100 displays, a ratio percentage of brightness of the first light emission regions 10a to brightness of the second light emission region 10b is greater than or equal to 97%, which advantages a difference of the brightness of the first light emission regions 10a from the brightness of the second light emission region 10b unable to be easily sensed by human's eyes to further prevent the splicing gap M from being recognized by human's eyes.

A ratio percentage of brightness of the first light emission regions 10a to brightness of the second light emission region 10b can be 97.5%, 98%, 98.5%, 99%.

In particular, a ratio percentage of a difference value of the first interval P1 from the second interval P2 to the second interval P2 is less than or equal to 5% such that a ratio percentage of brightness of the first light emission regions 10a to brightness of the second light emission region 10b is greater than or equal to 97%.

A ratio percentage of a difference value of the first interval P1 from the second interval P2 to the second interval P2 can be 0.1%, 0.2%, 0.5%, 0.8%, 1%, 1.2%, 1.5%, 1.8%, 2%, 2.2%, 2.5%, 3%, 3.2%, 3.5%, 4%, 4.2%, 4.5% and 4.8%.

The second interval P2 is 0.8 millimeters to 1.5 millimeters. For example, the second interval P2 is 0.8 millimeters, 1.0 millimeters, 1.2 millimeters, 1.3 millimeters, or 1.5 millimeters.

Figure 5:
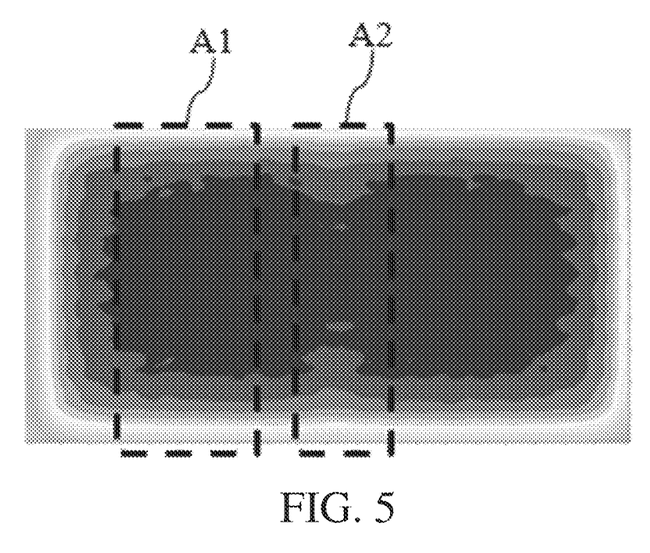
FIG. 5 is an optical simulation view of the splicing display device in FIG. 1 when a ratio percentage of a difference value of the first interval P1 from the second interval P2 to the second interval P2 is equal to 5%.

With reference to FIG. 5, when a ratio percentage of a difference value of the first interval P1 from the second interval P2 to the second interval P2 is equal to 5%, a ratio percentage of brightness of the first light emission regions 10a to brightness of the second light emission region 10b is 97%, at this time, a difference of brightness of the first light emission regions 10a and the splicing gap M (corresponding to A2 region) from brightness of the second light emission region 10b (corresponding to A1 region) cannot be recognized by human's eyes.

Figure 6:
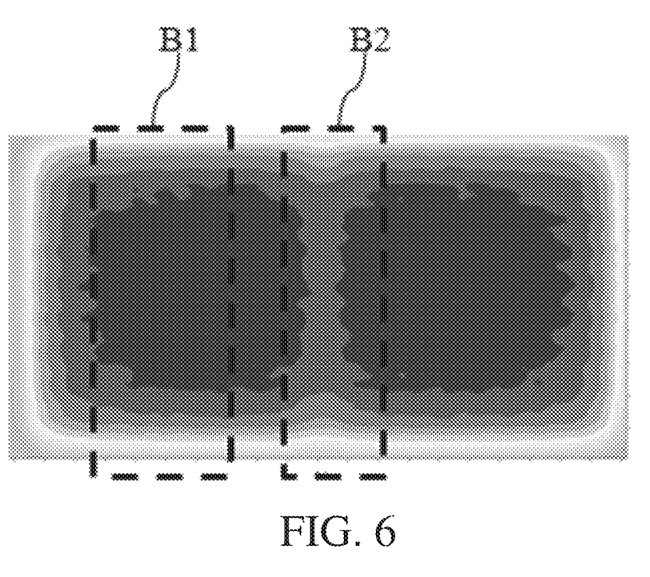
FIG. 6 is an optical simulation view of the splicing display device in FIG. 1 when a ratio percentage of a difference value of the first interval P1 from the second interval P2 to the second interval P2 is equal to 10%.

With reference to FIG. 6, when a ratio percentage of a difference value of the first interval P1 from the second interval P2 to the second interval P2 is equal to 10%, a ratio percentage of brightness of the first light emission regions 10a to brightness of the second light emission region 10b is 95%, at this time, a difference of brightness of the first light emission regions 10a and the splicing gap M (corresponding to B2 region) from brightness of the second light emission region 10b (corresponding to B1 region) is easily recognized by human's eyes.

With further reference to FIGS. 2 to 4, along the first direction, a third interval P3 is defined between adjacent two of the light emission units 102 disposed in the third light emission region 10c, the third interval P3 is less than or equal to the first interval P1, the third intervals P3 among at least some adjacent two of the light emission units 102 are less than the second interval P2, which advantages more light emission units 102 disposed in the third light emission region 10c to further guarantee improvement of a resolution of the splicing display device 100.

It should be explained that compared to an unchanged interval between any adjacent two of the light emission units of a conventional light emission substrate, the first interval P1 of the present application is greater than the second interval P2, which results in a reduced number of first light emission units 102 that can be disposed in the first light emission regions 10a of the light emission substrates 10. Setting the third intervals P3 among at least some adjacent two of the light emission units 102 to be less than the second interval P2 advantages more of the light emission units 102 disposed in the third light emission region 10c to prevent the splicing gap M from recognition by human's eyes and to guarantee improvement of a resolution of the splicing display device 100.

A ratio percentage of an absolute value of a difference value of the second interval P2 from the third interval P3 to the second interval P2 is greater than 0% and is less than or equal to 5%, which advantages a difference of brightness of the third light emission region 10c from brightness of the second light emission region 10b not recognized by human's eyes.

A ratio percentage of an absolute value of a difference value of the second interval P2 from the third interval P3 to the second interval P2 can be 0.1%, 0.2%, 0.5%, 0.8%, 1%, 1.2%, 1.5%, 1.8%, 2%, 2.2%, 2.5%, 3%, 3.2%, 3.5%, 4%, 4.2%, 4.5% and 4.8%.

Furthermore, the second interval P2 is greater than the third interval P3, and a ratio percentage of a difference value of the second interval P2 from the third interval P3 to the second interval P2 is less than or equal to 5%, which guarantees a difference of brightness of the third light emission region 10c from brightness of the second light emission region 10b not recognized by human's eyes to further make the second light emission region 10b accommodate more of the light emission units 102 to further improve the entire resolution of the splicing display device 100.

It can be understood that in the third light emission region 10c, some of the third intervals P3 among adjacent two of the light emission units 102 can be less than the second interval P2, some of the third intervals P3 among adjacent two of the light emission units 102 can be greater than the second interval P2. However, overall, an average of the third intervals P3 among adjacent two of the light emission units 102 in the third light emission region 10c is less than the second interval P2 to guarantee the third light emission region 10c to be able to accommodate more of the light emission units 102 to further guarantee an entire resolution of the splicing display device 100.

A ratio percentage of a difference value of the first interval P1 from the third interval P3 to the third interval P3 is greater than or equal to 0% and is less than or equal to 5% such that a difference of the brightness of the third light emission region 10c from the brightness of the first light emission regions 10a cannot be recognized by human's eyes.

With reference to FIGS. 2 to 4, a plurality of the light emission units 102 comprises a first light emission unit 1021, a second light emission unit 1022, a third light emission unit 1023, a fourth light emission unit 1024, a fifth light emission unit 1025, a sixth light emission unit 1026, and a seventh light emission unit 1027 disposed in the third light emission region 10c and are disposed sequentially adjacent to one another along a direction from a location near the second light emission region 10b to a location away from the second light emission region 10b.

With reference to FIG. 2, the second intervals P2 among any adjacent two of the light emission units 102 located in the second light emission region 10b are equal. The first intervals P1 among any adjacent two of the light emission units 102 located in the first light emission regions 10a are equal. Along a direction from a location near the second light emission region 10b to a location away from the second light emission region 10b, the third intervals P3 among adjacent two of the light emission units 102 disposed in the third light emission region 10c gradually decrease and then gradually increase.

In particular, in the third light emission region 10c, the first light emission unit 1021, the second light emission unit 1022, the third light emission unit 1023, and the fourth light emission unit 1024 are located in the decrement region of the third intervals P3 each of which is between adjacent two of the light emission units 102. The third interval P3 between the first light emission unit 1021 and the second light emission unit 1022, the third interval P3 between the second light emission unit 1022 and the third light emission unit 1023, and the third interval P3 between the third light emission unit 1023 and the fourth light emission unit 1024 gradually decrease.

A ratio percentage of a difference value of the third interval P3 between the first light emission unit 1021 and the second light emission unit 1022 from the third interval P3 between the second light emission unit 1022 and the third light emission unit 1023 to the third interval P3 between the first light emission unit 1021 and the second light emission unit 1022 or the third interval P3 between the second light emission unit 1022 and the third light emission unit 1023 is greater than or equal to 0.3% and is less than or equal to 0.6% such that the third intervals P3 gradually decrease at a suitable variation rate, which guarantees the third light emission region 10c along the first direction having a suitable size, prevents the size of the third light emission region 10c along the first direction from being excessively narrow and resulting in rough images displayed by the splicing display device 100, and prevents the size of the third light emission region 10c along the first direction from being excessively wide and increasing difficulty of manufacturing processes of the splicing display device 100.

A ratio percentage of a difference value of the third interval P3 between the first light emission unit 1021 and the second light emission unit 1022 from the third interval P3 between the second light emission unit 1022 and the third light emission unit 1023 to the third interval P3 between the first light emission unit 1021 and the second light emission unit 1022 or the third interval P3 between the second light emission unit 1022 and the third light emission unit 1023 can be 0.3%, 0.35%, 0.4%, 0.42%, 0.45%, 0.48%, 0.5% and 0.55%.

In particular, a ratio percentage of a difference value of the third interval P3 between the first light emission unit 1021 and the second light emission unit 1022 from the third interval P3 between the second light emission unit 1022 and the third light emission unit 1023 to the third interval P3 between the first light emission unit 1021 and the second light emission unit 1022 is greater than or equal to 0.3% and is less than or equal to 0.6%.

It should be explained that a ratio percentage of a difference value of the third interval P3 between the first light emission unit 1021 and the second light emission unit 1022 from the third interval P3 between the second light emission unit 1022 and the third light emission unit 1023 to the third interval P3 between the first light emission unit 1021 and the second light emission unit 1022 or the third interval P3 between the second light emission unit 1022 and the third light emission unit 1023 is greater than or equal to 0.3% and is less than or equal to 0.6%, which is adapted for any adjacent three of the light emission units 102 located in a decrement region of the third intervals P3 of the third light emission region 10c and along the first direction.

Furthermore, in the third light emission region 10c, the fifth light emission unit 1025, the sixth light emission unit 1026, and the seventh light emission unit 1027 are located in the increment region of the third intervals P3 each of which is between adjacent two of the light emission units 102. The third interval P3 between the fifth light emission unit 1025 and the sixth light emission unit 1026 and the third interval P3 between the sixth light emission unit 1026 and the seventh light emission unit 1027 gradually increase.

A ratio percentage of a difference value of the third interval P3 between the sixth light emission unit 1026 and the seventh light emission unit 1027 from the third interval P3 between the sixth light emission unit 1026 and the fifth light emission unit 1025 to the third interval P3 between the sixth light emission unit 1026 and the fifth light emission unit 1025 or the third interval P3 between the sixth light emission unit 1026 and the seventh light emission unit 1027 is greater than or equal to 0.3% and is less than or equal to 0.6%, which further guarantees that the third light emission region 10c along the first direction has a suitable size to prevent a size of the third light emission region 10c along the first direction from being excessively narrow and causing rough images displayed by the splicing display device 100 and also prevent a size of the third light emission region 10c along the first direction from being excessively wide and increasing difficulty of manufacturing processes of the splicing display device 100. A ratio percentage of a difference value of the third interval P3 between the sixth light emission unit 1026 and the seventh light emission unit 1027 from the third interval P3 between the sixth light emission unit 1026 and the fifth light emission unit 1025 to the third interval P3 between the sixth light emission unit 1026 and the fifth light emission unit 1025 or the third interval P3 between the sixth light emission unit 1026 and the seventh light emission unit 1027 can be 0.3%, 0.35%, 0.4%, 0.42%, 0.45%, 0.48% and 0.5%.

In particular, A ratio percentage of a difference value of the third interval P3 between the sixth light emission unit 1026 and the seventh light emission unit 1027 from the third interval P3 between the sixth light emission unit 1026 and the fifth light emission unit 1025 to the third interval P3 between the sixth light emission unit 1026 and the fifth light emission unit 1025 is greater than or equal to 0.3% and is less than or equal to 0.6%.

It should be explained that a ratio percentage of a difference value of the third interval P3 between the sixth light emission unit 1026 and the seventh light emission unit 1027 from the third interval P3 between the sixth light emission unit 1026 and the fifth light emission unit 1025 to the third interval P3 between the sixth light emission unit 1026 and the fifth light emission unit 1025 or the third interval P3 between the sixth light emission unit 1026 and the seventh light emission unit 1027 is greater than or equal to 0.3% and is less than or equal to 0.6%, which is adapted for any adjacent three of the light emission units 102 located in an increment region of the third intervals P3 of the third light emission region 10c and along the first direction.

With reference to FIG. 3, the second intervals P2 among any adjacent two of the light emission units 102 located in the second light emission region 10b are equal. Along a direction from a location away from the splicing gap M to a location near the splicing gap M, the first intervals P1 among at least some adjacent two of the light emission units 102 located in the first light emission regions 10a gradually increase. Along a direction from a location near the second light emission region 10b to a location away from the second light emission region 10b, the third intervals P3 among adjacent two of the light emission units 102 disposed in the third light emission region 10c gradually decrease and then keep constant.

In particular, in the third light emission region 10c, the third interval P3 between the first light emission unit 1021 and the second light emission unit 1022, the third interval P3 between the second light emission unit 1022 and the third light emission unit 1023, and the third interval P3 between the third light emission unit 1023 and the fourth light emission unit 1024 sequentially gradually decrease. the third interval P3 between the fourth light emission unit 1024 and the fifth light emission unit 1025, the third interval P3 between the fifth light emission unit 1025 and the sixth light emission unit 1026, and the third interval P3 between the sixth light emission unit 1026 and the seventh light emission unit 1027 are equal. The third interval P3 between the third light emission unit 1023 and the fourth light emission unit 1024 is greater than the third interval P3 between the fourth light emission unit 1024 and the fifth light emission unit 1025.

With reference to FIG. 4, the second intervals P2 among any adjacent two of the light emission units 102 located in the second light emission region 10b are equal. The first intervals P1 among any adjacent two of the light emission units 102 located in the first light emission regions 10a are equal. Along a direction from a location near the second light emission region 10b to a location away from the second light emission region 10b, the third intervals P3 among adjacent two of the light emission units 102 disposed in the third light emission region 10c gradually decrease first, then keep constant, and then gradually increase.

In particular, in the third light emission region 10c, the third interval P3 between the first light emission unit 1021 and the second light emission unit 1022 and the third interval P3 between the second light emission unit 1022 and the third light emission unit 1023 gradually decrease. The third interval P3 between the third light emission unit 1023 and the fourth light emission unit 1024 is the same as the third interval P3 between the fourth light emission unit 1024 and the fifth light emission unit 1025. the third interval P3 between the fifth light emission unit 1025 and the sixth light emission unit 1026 and the third interval P3 between the sixth light emission unit 1026 and the seventh light emission unit 1027 gradually increase. The third interval P3 between the second light emission unit 1022 and the third light emission unit 1023 is greater than the third interval P3 between the third light emission unit 1023 and the fourth light emission unit 1024, and the third interval P3 between the fifth light emission unit 1025 and the sixth light emission unit 1026 is less than the third interval P3 between the third light emission unit 1023 and the fourth light emission unit 1024.

It should be explained that an decrement method of the third interval P3 in FIG. 3 is the same as that in FIG. 2, and decrement and increment methods of the third interval P3 in FIG. 4 are the same as those in FIG. 2, which is not described in detail here.

Figure 7:
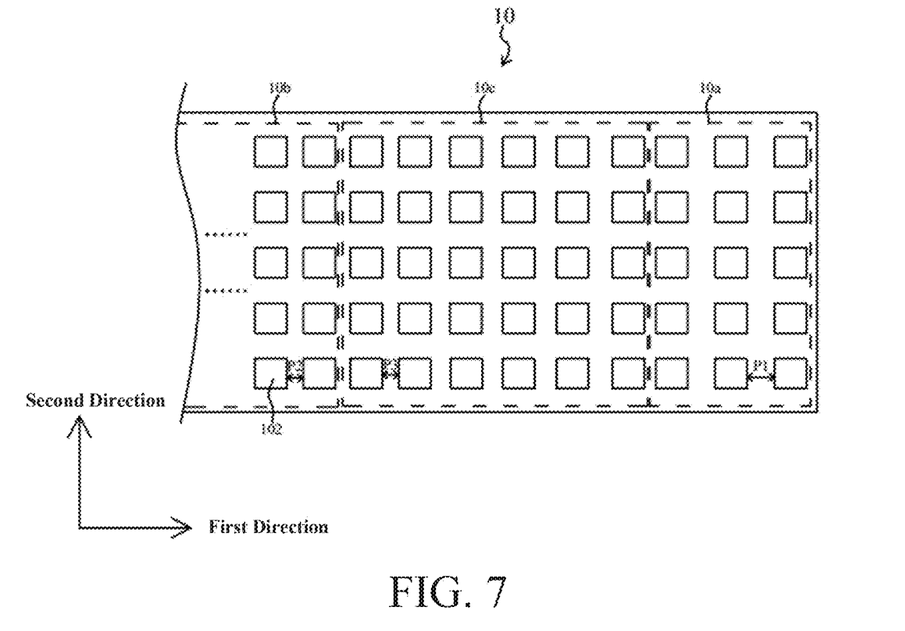
FIG. 7 is a partially enlarged schematic view of the light emission substrates of the splicing display device of the second embodiment of the present application.

With reference to FIG. 7, FIG. 7 is a partially enlarged schematic view of the light emission substrates of the splicing display device of the second embodiment of the present application. The splicing display device of FIG. 7 is basically similar to the splicing display device of FIG. 1, and a difference therebetween comprises, along the first direction, a third interval P3 is defined between adjacent two of the light emission units 102 disposed in the third light emission region 10c, the third interval P3 is greater than the second interval P2 and is less than the first interval P1.

In particular, the second intervals P2 among any adjacent two of the light emission units 102 located in the second light emission region 10b are equal. The first intervals P1 among any adjacent two of the light emission units 102 located in the first light emission regions 10a are equal. Along a direction from a location near the second light emission region 10b to a location away from the second light emission region 10b. The third intervals P3 among adjacent two of the light emission units 102 disposed in the third light emission region 10c gradually increase.

A ratio percentage of a difference value of the third interval P3 from the second interval P2 to the second interval P2 is less than or equal to 5%, which advantages a difference of brightness of the third light emission region 10c from brightness of the second light emission region 10b not recognized by human's eyes.

In the present embodiment, the third interval P3 is greater than the second interval P2 and is less than the first interval P1 such that brightness of light emitted from the light emission units 102 in the third light emission region 10c is less than brightness of light emitted from the light emission units 102 in the second light emission region 10b and is greater than brightness of light emitted from the light emission units 102 in the first light emission regions 10a. The brightness of light emitted from the light emission units 102 in the second light emission region 10b, the brightness of light emitted from the light emission units 102 in the third light emission region 10c, and the brightness of light emitted from the light emission units 102 in the first light emission regions 10a gradually decrease with the brightness of light emitted from the light emission units 102 in the first light emission regions 10a tending to be the same as the brightness of the splicing gap M to further prevent the splicing gap M from being recognized by human's eyes.

The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not make the essence of the technical solutions depart from a range of the technical solutions of the embodiments of the present application.

What is claimed is:

1. A splicing display device, wherein the splicing display device comprises:

at least two light emission substrates spliced together, wherein a splicing gap is formed between adjacent two of the light emission substrates spliced together along a first direction, the first direction intersects an extension direction of the splicing gap, the light emission substrates comprises a light emission region, the light emission region comprises a first light emission region and a second light emission region arranged abreast along the first direction, the first light emission region is disposed adjacent to the splicing gap, the first light emission region is located between the second light emission region and the splicing gap, and the light emission substrates comprises:

a plurality of light emission units disposed in the light emission region, wherein along the first direction, a first interval is defined between adjacent two of the light emission units disposed in the first light emission region, a second interval is defined between adjacent two of the light emission units disposed in the second light emission region, the first interval is greater than the second interval, and a ratio percentage of a difference value of the first interval from the second interval to the second interval is less than or equal to 5%;

wherein when the splicing display device displays, a ratio percentage of brightness of the first light emission region to brightness of the second light emission region is greater than or equal to 97%;

wherein the light emission region further comprises a third light emission region disposed between the first light emission region and the second light emission region; and along the first direction, a third interval is defined between adjacent two of the light emission units disposed in the third light emission region, the third interval is less than or equal to the first interval, at least some of the third intervals of adjacent two of the light emission units are less than the second interval;

wherein a ratio percentage of an absolute value of a difference value of the second interval from the third interval to the second interval is greater than 0% and is less than or equal to 5%;

wherein along a direction from a location near the second light emission region to a location away from the second light emission region, the third intervals each of which is between adjacent two of the light emission units disposed in the third light emission region gradually decrease and then keep constant;

wherein the second intervals among any adjacent two of the light emission units located in the second light emission region are equal, and along a direction from a location away from the splicing gap to a location near the splicing gap, the first intervals among at least some adjacent two of the light emission units gradually increase.

2. A splicing display device, wherein the splicing display device comprises:
at least two light emission substrates spliced together, wherein a splicing gap is formed between adjacent two of the light emission substrates spliced together along a first direction, the first direction intersects an extension direction of the splicing gap, the light emission substrates comprises a light emission region, the light emission region comprises a first light emission region and a second light emission region arranged abreast along the first direction, the first light emission region is disposed adjacent to the splicing gap, the first light emission region is located between the second light emission region and the splicing gap, and the light emission substrates comprises:
a plurality of light emission units disposed in the light emission region;
wherein along the first direction, a first interval is defined between adjacent two of the light emission units disposed in the first light emission region, a second interval is defined between adjacent two of the light emission units disposed in the second light emission region, the first interval is greater than the second interval;
wherein the light emission region further comprises a third light emission region disposed between the first light emission region and the second light emission region; and along the first direction, a third interval is defined between adjacent two of the light emission units disposed in the third light emission region, the third interval is less than or equal to the first interval, at least some of the third intervals of adjacent two of the light emission units are less than the second interval;
wherein a ratio percentage of an absolute value of a difference value of the second interval from the third interval to the second interval is greater than 0% and is less than or equal to 5%;
wherein along a direction from a location near the second light emission region to a location away from the second light emission region, the third intervals each of which is between adjacent two of the light emission units disposed in the third light emission region gradually decrease and then keep constant;
wherein the second intervals among any adjacent two of the light emission units located in the second light emission region are equal, and along a direction from a location away from the splicing gap to a location near the splicing gap, the first intervals among at least some adjacent two of the light emission units gradually increase.

3. The splicing display device according to claim 2, wherein when the splicing display device displays, a ratio percentage of brightness of the first light emission region to brightness of the second light emission region is greater than or equal to 97%.

4. The splicing display device according to claim 2, wherein a ratio percentage of a difference value of the first interval from the second interval to the second interval is less than or equal to 5%.

* * * * *